United States Patent
Jacquet et al.

(10) Patent No.: US 6,515,930 B2
(45) Date of Patent: Feb. 4, 2003

(54) DRAM CELL READING METHOD AND DEVICE

(75) Inventors: François Jacquet, Froges (FR); Florent Vautrin, Crolles (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/135,981

(22) Filed: Apr. 29, 2002

(65) Prior Publication Data

US 2002/0159321 A1 Oct. 31, 2002

(30) Foreign Application Priority Data

Apr. 30, 2001 (FR) .............................................. 01 05814

(51) Int. Cl.[7] ................................................. G11C 7/00
(52) U.S. Cl. .................. 365/222; 365/149; 365/189.07; 365/203
(58) Field of Search ........................... 365/222, 189.07, 365/203, 149

(56) References Cited

U.S. PATENT DOCUMENTS

| 3,678,473 | A |   | 7/1972 | Wahlstrom ................... 365/149 |
| 6,038,187 | A | * | 3/2000 | El Hajji ....................... 365/222 |
| 6,295,243 | B1 | * | 9/2001 | Otsuka et al. ............... 365/222 |
| 6,434,075 | B2 | * | 8/2002 | Ooishi .......................... 365/222 |

FOREIGN PATENT DOCUMENTS

FR          2 773 634          7/1999

* cited by examiner

*Primary Examiner*—Trong Phan
(74) *Attorney, Agent, or Firm*—Lisa K. Jorgenson; Harold H. Bennett, II; Seed IP Law Group PLLC

(57) ABSTRACT

A device for reading from a capacitive memory cell, including a comparator of the voltage stored in the memory cell with respect to a reference value, which exhibits a high input impedance; a refreshment means distinct from the comparator, the refreshment means having a low output impedance and being controlled by the comparator to impose a refreshment voltage to the memory cell; and means for controllably connecting the refreshment means to the memory cell.

16 Claims, 4 Drawing Sheets

DRAM CELL READING METHOD AND DEVICE

BACKGROUND OF THE INVENTION

1. Field of the Invention

The present invention relates to DRAMs and more specifically to a method and a device for reading a DRAM.

2. Description of the Related Art

A DRAM includes memory cells in which a logic information "1" or "0" can be stored. Each memory cell includes a capacitor in which a predetermined voltage chosen from among two values is stored according to whether a "1" or a "0" is to be stored. The capacitor of a memory cell can never be perfectly isolated and the voltage kept by the capacitor is not stable and declines along time. After a determined duration, called the retention period, the voltage stored in the capacitor of a memory cell may thus be too low to be readable. To avoid loosing the information stored in each capacitor, a refreshment of the voltage stored in each capacitor is periodically performed. For this purpose, a read device periodically compares the voltage stored in each capacitor with a reference voltage, then recharges each capacitor to one or the other of the predetermined voltages according to whether the compared voltage is greater or smaller than the reference voltage.

FIG. 1 schematically shows the structure of a conventional DRAM organized in rows and columns. Three cells M1, M2, and Mn of a same column have been shown, where n is the number of rows in the memory. Each memory cell Mi, where i ranges between 1 and n, includes a capacitor Ci having a first terminal connected to a reference voltage Vp. A second terminal of capacitor Ci is connected to a bit line BL via a switch Si. The second terminal of capacitor Ci forms an input/output terminal of memory cell Mi. The control terminal of switch Si is a selection terminal of memory cell Mi, and receives a selection signal WLi. Bit line BL is connected to an input terminal of a read device 6 via a switch 8. Device 6 includes two identical inverters 10 and 12 assembled in antiparallel. Input I10 of inverter 10 and the output of inverter 12 form the input terminal of device 6. The output of inverter 10 is connected to input I12 of inverter 12. A high supply terminal of inverters 10 and 12 is connected to a supply voltage Vdd via a switch 14. A low supply terminal of inverters 10 and 12 is connected to a ground voltage GND via a switch 16. The input of inverter 12 is connected to a reference bit line BLref via a switch 18. Reference bit line BLref is provided to have a stray capacitance identical to that of bit line BL. A reference memory cell Mref, having a structure identical to any one of memory cells Mi, is connected to reference bit line BLref. Cell Mref includes a capacitor Cref connected to bit line BLref via a switch Sref. Capacitor Cref has the same value as any one of capacitors Ci. The selection terminal of memory cell Mref receives a control signal WLref. A precharge circuit 22, controlled by a signal PRA, is connected to terminals I10 and I12. Precharge circuits, not shown, controlled by signal PRA, are connected to lines BL and BLref and to the input/output terminal of memory cell Mref. Switches 8 and 18 receive a same control signal PASS. Switch 14 receives a control signal RESTORE. Switch 16 receives a control signal SENSE. Control signals WLi, WLref, PASS, RESTORE, and PRA are generated by control means not shown.

FIG. 2 illustrates the variation along time of signals WLi and WLref, of the voltages of terminals I10 and I12, and of signals PASS, SENSE, RESTORE, and PRA upon refreshment of a memory cell Mi by device 6. At an initial time t0, signals WLi and WLref are at 0 and capacitors Ci and Cref of memories Mi and Mref are isolated from lines BL and BLref. Signal PASS is at 0 and terminals I10 and I12 are isolated from lines BL and BLref. Signals SENSE and RESTORE are at 0 and inverters 10 and 12 are deactivated. Signal PRA is at 1 and block 22 forces the voltages of terminals I10 and I12 to a voltage Vdd/2. Similarly, precharge circuits, not shown, force bit lines BL and BLref to voltage Vdd/2, and the input/output terminal of cell Mref to a reference voltage, which is considered, for simplification, to be equal to Vdd/2. At a time t1, signal PRA is brought to 0. The precharge circuits are then deactivated. At a time t2, signals WLi, WLref and PASS are brought to 1. Capacitors Ci and Cref are then respectively connected to terminals I10 and I12. Bit line BL and terminal I10 each exhibit a predetermined impedance, mainly capacitive. From time t2, the charges stored in capacitor Ci distribute between capacitor Ci and the stray capacitances of line BL and of terminal I10. FIG. 2 illustrates an example in which a positive voltage Vdd/2+ΔV is stored in capacitor Ci before time t2. After time t2, the charges which were stored in capacitor Ci distribute between capacitor Ci and the stray capacitances of line BL and of terminal I10. Terminal I10 is thus brought to a voltage Vdd/2+δV smaller than voltage Vdd/2+ΔV. Terminal I12, connected to line BLref and to capacitor Cref, remains at voltage Vdd/2. At a time t3, signal SENSE is brought to 1 to turn switch 16 on. The low supply terminals of inverters 10 and 12 are then connected to voltage GND. As a response to voltage Vdd/2+δV of terminal I10, inverter 10 forces terminal I12 and line BLref to voltage GND. At a time t4, signal RESTORE is brought to 1 to turn switch 14 on. Inverters 10 and 12 are then supplied by voltage Vdd, and inverter 12 forces terminal I10 and line BL to voltage Vdd. Capacitor Ci is then recharged by inverter 12, and the operation of refreshing cell Mi is over. At a time t5, control signals WLi and WLref are brought to 0 to isolate capacitors Ci and Cref from bit lines BL and BLref. At a time t6, signals SENSE and RESTORE are brought to 0 to turn switches 14 and 16 off and deactivate inverters 10 and 12. At a time t7, signal PASS is brought to 0, to turn off switches 8 and 18 and to isolate terminals I10 and I12 from lines BL and BLref. At a time t7, signal PRA is brought to 1 to control the precharge of terminals I10 and I12, of lines BL and BLref, and of capacitor Cref, to prepare a next refreshment operation.

A read operation in memory Mi is identical to the refreshment operation just described. The result of the read operation is for example indicated by the state of terminal I10 at time t5. A write operation into cell Mi, in which a means not shown forces the state of terminal I10 whatever the voltage stored in capacitor Ci, is not described herein.

If voltage Vdd/2+δV provided at the input terminal of device 6 in a refreshment or read operation is insufficient to control it, said device cannot operate satisfactorily. Voltage Vdd/2+δV depends on voltage Vdd/2+ΔV stored in capacitor Ci of the memory cell, and on the ratio between capacitor Ci and the stray capacitances of the bit line and of the input terminal of device 6.

Technological progress and the more and more advanced integration of memory circuits cause a reduction in the size of capacitors Ci and in supply voltage Vdd. A first consequence is that the voltages stored in the memory cells are smaller and smaller. A second consequence is that the memory cell capacitors have lower and lower values as compared to the stray capacitances of the bit line and of the read device input terminal. As a result, the potential difference δV to be detected in a reading decreases. Indeed, the stray capacitance of the bit line, which depends on the length and on the surface area of the bit line, is difficult to reduce. The stray capacitance of the input terminal of device 6 especially depends on the size of the gates of the transistors forming inverters 10 and 12. Now, inverters 10 and 12 have a high output impedance to be able to control the memory cell charge via the bit lines. Inverters 10 and 12 are thus formed of large transistors having a high gate capacitance and the stray capacitance of the input terminal of device 6 is also difficult to reduce.

A known solution consists of reducing the time interval between two refreshment operations. However, an increase in the refreshment frequency raises many problems, especially an increase in the memory consumption and less availability thereof for read/write operations.

BRIEF SUMMARY OF THE INVENTION

An embodiment of the present invention provides a device and a method for reading from a memory cell, which enable using memory cells, the capacitor of which has a reduced value, and/or a reduced refreshment frequency.

An embodiment of the present invention provides a method for reading a voltage stored in a capacitive memory cell, including the successive steps of providing the stored voltage to a comparator having a high input impedance; generating, with a refreshment means having a low output impedance, a refreshment voltage having a first or a second value according to whether the stored voltage is smaller or greater than a reference voltage; and connecting an output terminal of the refreshment means to the memory cell, to store the refreshment voltage in the memory cell.

Another embodiment of the present invention also aims at a device for reading from a capacitive memory cell, including a comparator for comparing a voltage stored in the memory cell with respect to a reference value, which exhibits a high input impedance; a refreshment means distinct from the comparator, the refreshment means having a small output impedance and being controlled by the comparator to impose a refreshment voltage to the memory cell; and means for controllably connecting the refreshment means to the memory cell.

According to an embodiment of the present invention, a first input terminal of the comparator is directly connected to the memory cell by a first bit line, a first output terminal of the refreshment means being switchably connected to the first bit line.

According to an embodiment of the present invention, a second input terminal of the comparator is directly connected to a memory cell for storing the reference voltage by a second bit line, a second output terminal of the refreshment means being switchably connected to the second bit line.

According to an embodiment of the present invention, the comparator includes a first N-channel MOS transistor having its drain connected to a first output terminal of the comparator, and having its source connected to a low supply voltage via a first switch; and a second N-channel MOS transistor having its drain connected to a second output terminal of the comparator, having its source connected to the low supply voltage via a second switch, the first and second switches being controlled by a comparison control signal, and the gates of the first and second transistors forming the first and second input terminals of the comparator.

According to an embodiment of the present invention, the refreshment means includes a first inverter having an output terminal connected to an input terminal of a second inverter, the output terminal of the second inverter being connected to the input terminal of the first inverter, the high supply terminals of the first and second inverters being connected to a high supply voltage, the output terminals of the inverters forming the output terminals of the refreshment means.

According to an embodiment of the present invention, the refreshment means includes third and fourth switches adapted to connecting the low supply terminals of the first and second inverters to the low supply voltage, the low supply terminals of the first and second inverters being respectively directly connected to the first and second output terminals of the comparator.

According to an embodiment of the present invention, the comparator and the refreshment means are respectively associated with distinct precharge circuits.

According to an embodiment of the present invention, the comparator includes a first precharge circuit adapted to bringing the sources of the first and second transistors to the high supply voltage, and a second precharge circuit adapted to bringing the first and second output terminals of the comparator to the high supply voltage.

The present invention also aims at a memory circuit including an array network of memory cells each including a selection switch connecting a capacitive element of the cell to a bit line and having a control terminal connected to a word line, wherein each bit line or pair of bit lines is associated with a read device of the above type.

BRIEF DESCRIPTION OF THE SEVERAL VIEWS OF THE DRAWINGS

The foregoing features and advantages of the present invention will be discussed in detail in the following non-limiting description of specific embodiments, in conjunction with the accompanying drawings.

DETAILED DESCRIPTION OF THE INVENTION

Figure 1:
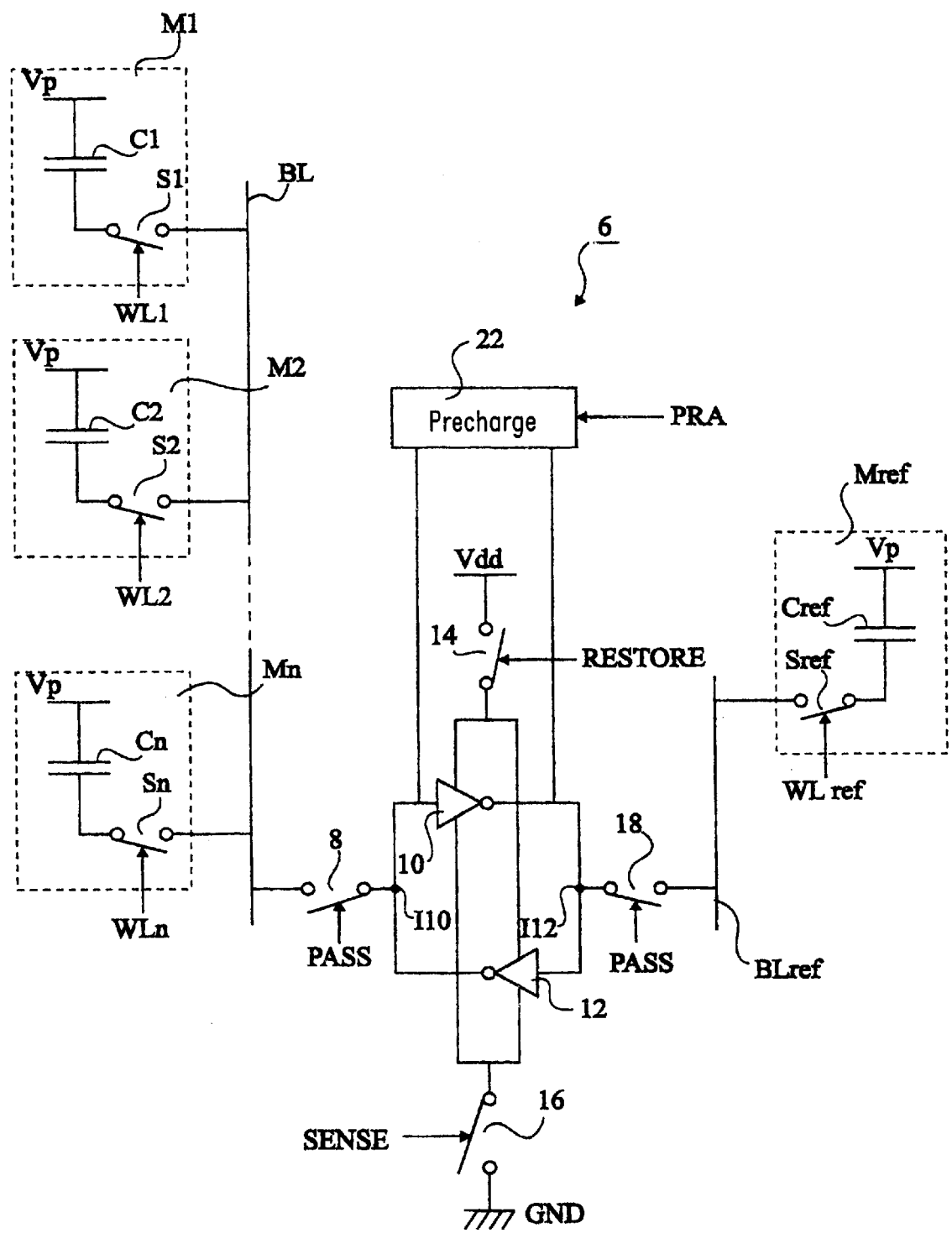
FIG. 1, previously described, schematically shows a column of memory cells and a conventional read device.
Figure 2:
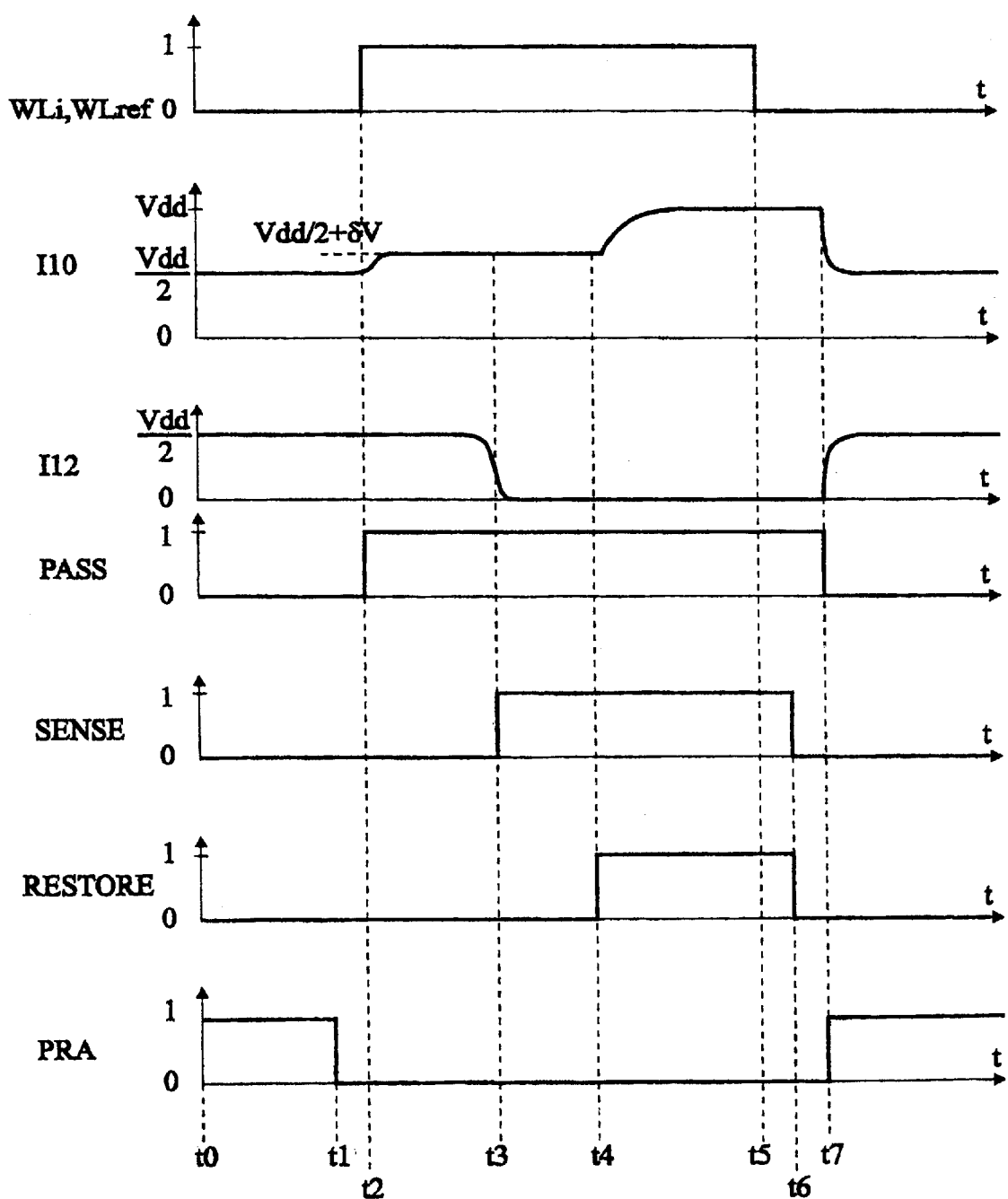
FIG. 2, previously described, illustrates the operation of the read device of FIG. 1.
Figure 3:
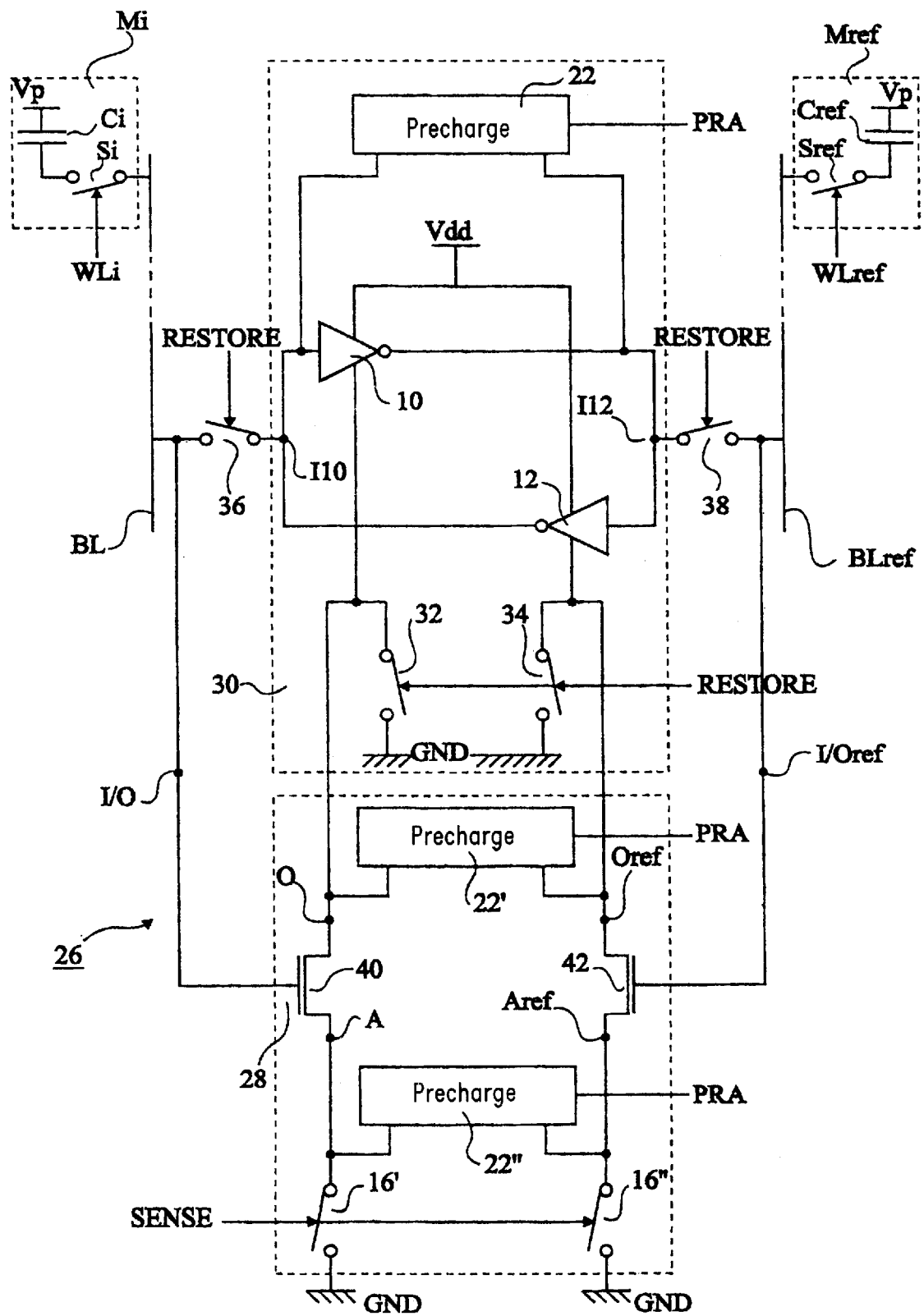
FIG. 3 schematically shows a read device according to the present invention.

Same references designate same elements in FIGS. 1 and 3. Only those elements necessary to the understanding of the present invention have been shown.

A feature of the present invention is to dissociate the means used for the comparison of the voltage stored in a cell for its reading and for the refreshment of this voltage.

The present invention provides a device for reading DRAM cells, including a voltage comparator with a high input impedance and a refreshment means with a low output impedance, distinct from the voltage comparator and controlled by the comparator. In a memory cell refreshment cycle, only the voltage comparator is, first, connected to the memory cell, to limit the distribution of the charges stored in the memory cell. Then, the refreshment means output terminal, controlled by the comparator, is connected to the memory cell for refreshment.

FIG. 3 schematically shows a DRAM cell read device 26 according to the present invention. Device 26 includes a first input/output terminal I/O connected to a memory cell Mi of a memory cell column not shown by a bit line BL and a second input/output terminal I/Oref connected to a reference memory cell Mref by a bit line BLref. Memory cells Mi and Mref are respectively conventionally controlled by signals WLi and WLref. Device 26 includes a comparator 28, a first input terminal of which is connected to terminal I/O and a second input terminal of which is connected to terminal I/Oref.

Comparator 28 includes an N-channel MOS transistor 40 having its gate connected to the first input terminal of comparator 28. The drain of transistor 40 is connected to a first output terminal O of comparator 28. The source of transistor 40 is connected to reference voltage GND (the ground) by a switch 16'. An N-channel MOS transistor 42 has its gate connected to the second input terminal of comparator 28. The drain of transistor 42 is connected to a second output terminal Oref of comparator 28. The source of transistor 42 is connected to voltage GND via a switch 16". Transistors 40 and 42 are matched so that their features are identical and remain so, for example, in case of a variation in the operating temperature. Transistors 40 and 42 are small transistors having a small gate capacitance. Switches 16' and 16" are controlled by a signal SENSE. Comparator 28 further includes precharge circuits 22' and 22" adapted to precharging terminals O and Oref, and the sources of transistors 40 and 42, respectively, to voltage Vdd. Circuits 22' and 22" are controlled by a signal PRA.

Device 26 also includes a refreshment means 30 comprised of two inverters 10 and 12, in antiparallel. Input I10 of inverter 10 is connected to the output of inverter 12. Input I12 of inverter 12 is connected to the output of inverter 10. The high supply terminals of inverters 10 and 12 are directly connected to voltage Vdd. The low supply terminals of inverters 10 and 12 are respectively connected to first and second output terminals O and Oref of comparator 28. Further, the low supply terminals of inverters 10 and 12 are each connected to voltage GND by a switch, respectively 32 and 34. Switches 32 and 34 are controlled by a signal RESTORE. Switches 36 and 38, also controlled by signal RESTORE, respectively connect terminal I10 to terminal I/O and terminal I12 to terminal I/Oref. Refreshment means 30 further includes a precharge circuit 22 controlled by signal PRA to precharge terminals I10 and I12 to voltage Vdd.

Figure 4:
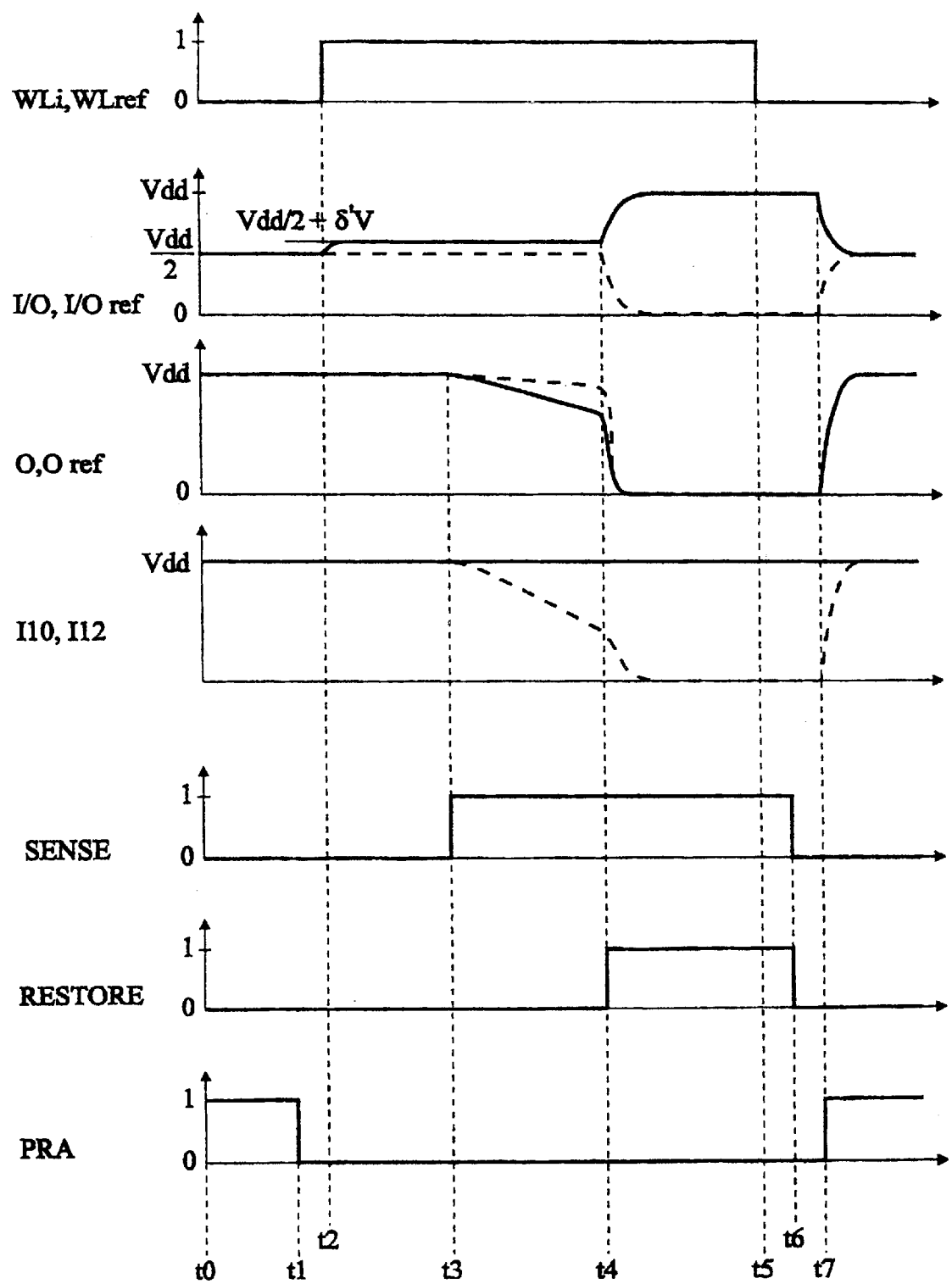
FIG. 4 illustrates the operation of the device of FIG. 3.

FIG. 4 illustrates the variation along time of signals WLi, WLref, of the voltages of terminals I/O, I/Oref, O, Oref, I10 and I12, and of signals SENSE, RESTORE, and PRA upon refreshment of memory cell Mi by device 26. The time scale is given as an example only. In practice, the illustrated signals may have a different aspect from the curves of FIG. 4. Before a refreshment, at a time t0, signals WLi and WLref are at 0 and capacitors Ci and Cref of memory cells Mi and Mref are not connected to terminals I/O and I/Oref. Signal SENSE is at 0 and comparator 28 is deactivated. Signal RESTORE is at 0, switches 32 and 34 are off and terminals I10 and I12 of refreshment means 30 are not connected to terminals I/O and I/Oref. Signal PRA is at 1, and circuits 22, 22', and 22" respectively precharge terminals I10, I12, O, and Oref, and the sources of transistors 40 and 42 to voltage Vdd. Further, precharge circuits not shown precharge bit lines BL and BLref and capacitor Cref to voltage Vdd/2.

At a time t1, signal PRA is brought to 0, and the precharge circuits are deactivated. At a time t2, signals WLi and WLref are brought to 1 to connect capacitor Ci to bit line BL and capacitor Cref to bit line BLref. From time t2, the charge stored in capacitor Ci distributes between capacitor Ci and the stray capacitances of bit line BL and of the gate of transistor 40. In the illustrated example, a voltage $Vdd/2+\Delta V$ was stored in capacitor Ci, and the voltage of terminal I/O, illustrated in full line, increases to reach a voltage $Vdd/2+\delta V'$. Voltage $Vdd/2+\delta V'$ corresponds to the distribution of the charges which used to form voltage $Vdd/2+\Delta V$, in capacitor Ci and in the stray capacitances of bit line BL and of the gate of transistor 40. The voltage of terminal I/Oref, illustrated in dotted lines, remains equal to $Vdd/2$.

At a time t3, signal SENSE is brought to 1, to turn on switches 16' and 16". Comparator 28 is then activated. Transistors 40 and 42 are turned on. In the illustrated example, the gate voltage of transistor 40 is greater than the gate voltage of transistor 42, and transistor 40 is more conductive than transistor 42. As a result, the voltage of terminal O, in full line, is brought to voltage GND faster than the voltage of terminal Oref, in dotted lines. The low supply voltage of inverter I10 (connected to terminal O) decreases faster than the low supply voltage of inverter 12 (connected to terminal Oref) and the voltage provided by inverter 10 drops faster than the voltage provided by inverter 12. Inverter 10 is supplied via transistor 40, of small size, and the voltage of terminal I12 is brought to voltage GND at a small speed depending on the current running through transistor 40.

At a time t4, signal RESTORE is brought to 1, to turn on switches 32, 34, 36, and 38. The turning-on of switches 32 and 34 brings terminals O and Oref to voltage GND. The low supply terminals of inverters 10 and 12 are then directly connected to voltage GND and the voltage of terminal I10 is rapidly brought to voltage GND. The turning-on of switches 36 and 38 connects terminals I10 and I12 to terminals I/O and I/Oref, respectively. Terminal I10 brings bit line BL to voltage Vdd, and terminal I12 brings bit line BLref to voltage GND. The voltage stored in capacitor Ci has been refreshed and the refreshment operation is then over.

At a time t5, control signals WLi and WLref are brought to 0, to isolate capacitors Ci and Cref from the bit lines. At a time t6, signals SENSE and RESTORE are brought to 0, to deactivate comparator 28 and refreshment means 30. At a time t7, signal PRA is brought to 1 to precharge bit lines BL and BLref, capacitor Cref, and the terminals of device 26 to prepare a next operation.

A read operation in memory cell Mi is identical to the refreshment operation just described. A write operation in cell Mi, conventionally performed by forcing the voltage of terminals I10 and by connecting terminals I10 and I/O, is not described herein. FIG. 4 illustrates the operation of device 26 when a voltage $Vdd/2+\Delta V$ is stored in capacitor Ci. The operation of device 26 is similar when a voltage $Vdd/2-\Delta V$ is stored in capacitor ci.

According to the present invention, transistors 40 and 42 of comparator 28 are transistors with gates having small stray capacitances. The stray capacitance of terminal I/O is substantially equal to the gate capacitance of transistor 40 when switch 36 is off. Then, the sum of the stray capacitances of bit line BL and of terminals I/O is small, and even a reduced voltage $Vdd/2+\Delta V$ enables bringing terminal I/O to a detectable voltage $Vdd+\delta V'$. A read device according to the present invention thus enables using small memory cells having a small capacitance or refreshing the memory cells less often.

Of course, the present invention is likely to have various alterations, modifications, and improvements which will readily occur to those skilled in the art. As an example, the present invention has been described in relation with a memory circuit including a bit line BL and a reference bit line BLref which are not identical. In practice, bit lines BL and BLref may be identical. Bit line BL will then include a reference memory cell Mref' and bit line BLref will then include n memory cells Mi'. Upon refreshment or reading of a memory cell Mi connected to bit line BL, memory cell Mref connected to bit line BLref is activated, as described previously. Upon refreshment or reading of a memory cell Mi' connected to bit line BLref, reference memory cell Mref connected to bit line BL is activated.

The present invention has been described in relation with a refreshment means 30 including switches 32 and 34 enabling direct connection of the supply voltages of inverters 10 and 12 to voltage GND. However, switches 32 and 34, which have the function of accelerating the switching of inverters 10 and 12, are not indispensable.

The present invention has been described in relation with, before each refreshment or read operation, a precharge of the input/output terminal of reference memory cell Mref to a voltage Vdd/2. In practice, the input/output terminal of the reference memory cell will be precharged to a predetermined voltage depending on the memory circuit.

Further, the present invention has been described with a device 26 for reading cells connected to a single bit line BL, but in practice, a memory circuit will include a great number of bit lines and a great number of read devices. On this regard, it should be noted that the slight surface area increase which is necessary, on the read device side, to implement the present invention, remains negligible, a same read device being shared by a large number of cells connected to a same bit line.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for reading a voltage stored in a capacitive memory cell, including the successive steps of:
   providing the stored voltage to a comparator having a high input impedance;
   generating, with a refreshment means having a low output impedance, a refreshment voltage having a first or a second value according to whether the stored voltage is smaller or greater than a reference voltage; and
   connecting an output terminal of the refreshment means to the memory cell, to store the refreshment voltage in the memory cell.

2. A device for reading from a capacitive memory cell, including:
   a comparator for comparing a voltage stored in the memory cell with respect to a reference value, which exhibits a high input impedance;
   a refreshment means distinct from the comparator, the refreshment means having a small output impedance and being controlled by the comparator to impose a refreshment voltage to the memory cell; and
   means for controllably connecting the refreshment means to the memory cell.

3. The read device of claim 2 wherein a first input terminal of the comparator is directly connected to the memory cell by a first bit line, a first output terminal of the refreshment means being switchably connected to the first bit line.

4. The read device of claim 2 wherein a second input terminal of the comparator is directly connected to a memory cell for storing the reference voltage by a second bit line, a second output terminal of the refreshment means being switchably connected to the second bit line.

5. The read device of claim 4 wherein the comparator includes:
   a first N-channel MOS transistor having its drain connected to a first output terminal of the comparator, and having its source connected to a low supply voltage via a first switch; and
   a second N-channel MOS transistor having its drain connected to a second output terminal of the comparator, having its source connected to the low supply voltage via a second switch, the first and second switches being controlled by a comparison control signal, and the gates of the first and second transistors forming the first and second input terminals of the comparator.

6. The read device of claim 4 wherein the refreshment means includes a first inverter having an output terminal connected to an input terminal of a second inverter, the output terminal of the second inverter being connected to the input terminal of the first inverter, the high supply terminals of the first and second inverters being connected to a high supply voltage, the output terminals of the inverters forming the output terminals of the refreshment means.

7. The read device of claims 6 wherein the refreshment means includes third and fourth switches adapted to connecting the low supply terminals of the first and second inverters to the low supply voltage, the low supply terminals of the first and second inverters being respectively directly connected to the first and second output terminals of the comparator.

8. The read device of any of claims 2 wherein the comparator and the refreshment means are respectively associated with distinct precharge circuits.

9. The read device of claims 8 wherein the comparator includes a first precharge circuit adapted to bringing the sources of the first and second transistors to the high supply voltage, and a second precharge circuit adapted to bringing the first and second output terminals of the comparator to the high supply voltage.

10. A memory circuit comprising:
   an array network of memory cells each including a selection switch connecting a capacitive element of the cell to a bit line and having a control terminal connected to a word line;
   a comparator selectively coupled to the bit line and configured to compare the voltage stored in the memory cell to a reference value, wherein the comparator exhibits a high input impedance;
   a refreshment means distinct from the comparator, the refreshment means having a small output impedance and being controlled by the comparator to impose a refreshment voltage to the memory cell; and
   means for controllably connecting the refreshment means to the memory cell.

11. A method, comprising:
   comparing a first voltage level, stored in a selected capacitive memory cell, with a second voltage level, stored in a reference memory cell, the comparing step including connecting a first input of a comparator having a high input impedance to the selected memory cell and connecting a second input of the comparator to the reference memory cell;

restoring a voltage level representing a first logic level to the selected memory cell if the first voltage level exceeds the second voltage level;

restoring a voltage level representing a second logic level to the selected memory cell if the second voltage level exceeds the first voltage level;

restoring a voltage representing a reference voltage level to the reference memory cell; and each of the restoring steps including connecting an output of a restoring circuit to the respective one of the memory cells, the output having a low output impedance.

12. The method of claim 11 further comprising:

reading the first logic level from the selected memory cell if the first voltage level exceeds the second voltage level;

reading the second logic level from the selected memory cell if the first voltage level does not exceed the second voltage level.

13. The method of claim 11 wherein the selected capacitive memory cell is one of a plurality of capacitive memory in a memory array and wherein the method further comprise the step of selecting another one of the plurality of memory cells.

14. A device comprising:

a selected capacitive memory cell having a first voltage level stored therein;

a reference capacitive memory cell having a second voltage level stored therein;

a comparator having a high input impedance;

a circuit configured to connect the selected memory cell to a first input of the comparator and the reference memory cell to a second input of the comparator; and a circuit having an input coupled to an output of the comparator, having a low output impedance and configured to refresh the selected memory cell with a voltage representing a first logic level if the first voltage is greater than the second voltage, to refresh the selected memory cell with a voltage representing a second logic level if the second voltage is greater than the first voltage and configured to refresh the reference memory cell with a reference voltage.

15. The device of claim 14, further comprising a circuit coupled to the output of the comparator and configured to read a first logic level from the selected capacitive memory cell if the first voltage is greater than the second voltage and to read a second logic level from the selected memory cell if the second voltage is greater than the first voltage.

16. The device of claim 14, further comprising a plurality of capacitive memory cells and a circuit configured to select the selected capacitive memory cell from among the plurality of memory cells.

* * * * *